(12) United States Patent
Miyauchi et al.

(10) Patent No.: US 12,225,827 B2
(45) Date of Patent: Feb. 11, 2025

(54) POWER GENERATION ELEMENT AND POWER GENERATION APPARATUS

(71) Applicant: CANON KABUSHIKI KAISHA, Tokyo (JP)

(72) Inventors: Yuichiro Miyauchi, Kanagawa (JP); Masakazu Mori, Kanagawa (JP); Noriyuki Chino, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 451 days.

(21) Appl. No.: 17/535,068

(22) Filed: Nov. 24, 2021

(65) Prior Publication Data

US 2022/0085271 A1     Mar. 17, 2022

Related U.S. Application Data

(63) Continuation of application No. PCT/JP2020/020540, filed on May 25, 2020.

(30) Foreign Application Priority Data

May 31, 2019   (JP) .................................. 2019-103231

(51) Int. Cl.
   *H01L 41/12*    (2006.01)
   *H02N 2/18*     (2006.01)
   *H10N 35/00*    (2023.01)

(52) U.S. Cl.
   CPC ......... *H10N 35/101* (2023.02); *H02N 2/186* (2013.01)

(58) Field of Classification Search
   CPC .............................. H02N 2/186; H10N 35/101
   (Continued)

(56) References Cited

U.S. PATENT DOCUMENTS 8,766,495 B2 *   7/2014   Ueno ................... H10N 35/101
                                                    310/26
9,543,499 B2 *   1/2017   Shimanouchi ......... H02N 2/186
                          (Continued)

FOREIGN PATENT DOCUMENTS

JP           4905820 B2      3/2012
JP      WO2011158473 A1      8/2013
                  (Continued)

OTHER PUBLICATIONS

Shigeyuki Hatta, et al., "Study on Battery Free Remote Controller Using Magnetostrictive-Vibrational Power Generation Switch" Journal of the Japan Society of Applied Electromagnetics and Mechanics (AEM), vol. 23, No. 1 (2015).

*Primary Examiner* — Alex W Mok
(74) *Attorney, Agent, or Firm* — Canon U.S.A., Inc. IP Division

(57) ABSTRACT

A power generation element includes a first magnetostrictive plate and a second magnetostrictive plate each including a magnetostrictive material, a magnet unit including a magnet fixed to at least one of the first magnetostrictive plate or the second magnetostrictive plate, and a coil containing at least part of the first magnetostrictive plate and the second magnetostrictive plate therein, wherein the first magnetostrictive plate and the second magnetostrictive plate are laid out in such a manner that stresses applied to the first magnetostrictive plate and the second magnetostrictive plate are in opposite directions to each other, and the magnet unit is disposed in such a manner that magnetic fields applied to the first magnetostrictive plate and the second magnetostrictive plate are in opposite directions to each other.

11 Claims, 11 Drawing Sheets

(58) Field of Classification Search
USPC .......................................................... 310/26
See application file for complete search history.

(56) References Cited

U.S. PATENT DOCUMENTS

| | | | | |
|---|---|---|---|---|
| 9,806,592 | B2* | 10/2017 | Toyoda | H02N 2/186 |
| 10,164,552 | B2* | 12/2018 | Shimanouchi | H10N 35/101 |
| 2013/0140919 | A1* | 6/2013 | Ueno | H10N 35/101 |
| | | | | 310/26 |
| 2013/0328316 | A1* | 12/2013 | Rodney | G01F 1/3209 |
| | | | | 310/26 |
| 2014/0333156 | A1* | 11/2014 | Toyoda | H10N 35/101 |
| | | | | 310/26 |
| 2014/0346902 | A1* | 11/2014 | Ueno | H10N 35/101 |
| | | | | 310/26 |
| 2015/0115748 | A1* | 4/2015 | Shimanouchi | H10N 35/101 |
| | | | | 310/26 |
| 2015/0303835 | A1* | 10/2015 | Katsumura | H10N 30/306 |
| | | | | 310/329 |
| 2016/0156286 | A1* | 6/2016 | Shimanouchi | H02N 2/186 |
| | | | | 310/339 |

FOREIGN PATENT DOCUMENTS

| | | | |
|---|---|---|---|
| JP | WO2012157246 | A1 | 7/2014 |
| JP | WO2013136364 | A1 | 7/2015 |
| WO | 2013136364 | A1 | 9/2013 |

* cited by examiner

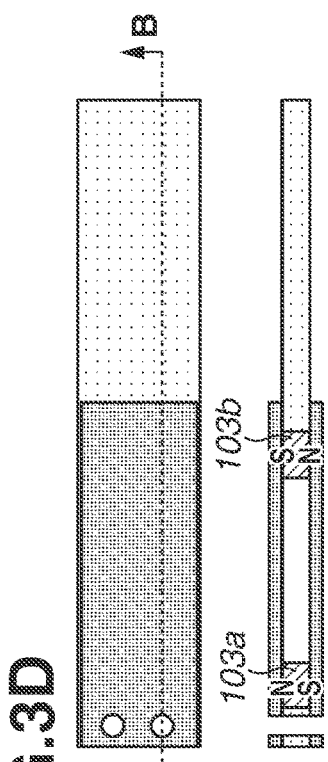
FIG.3A
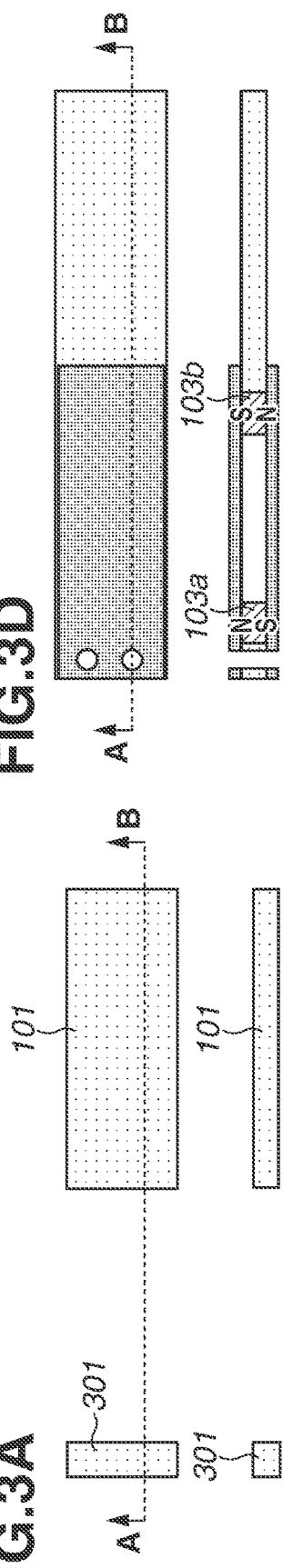
FIG.3B
FIG.3C
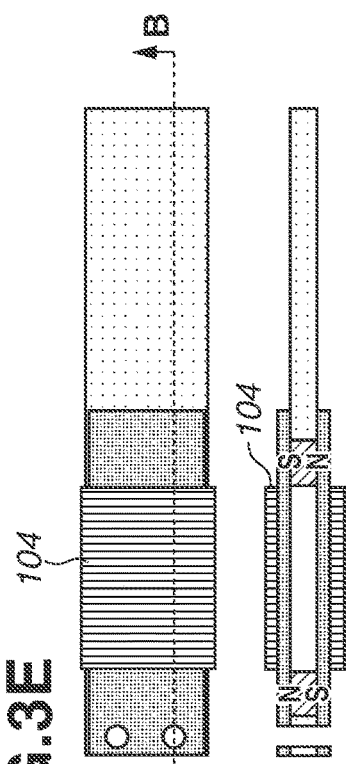
FIG.3D
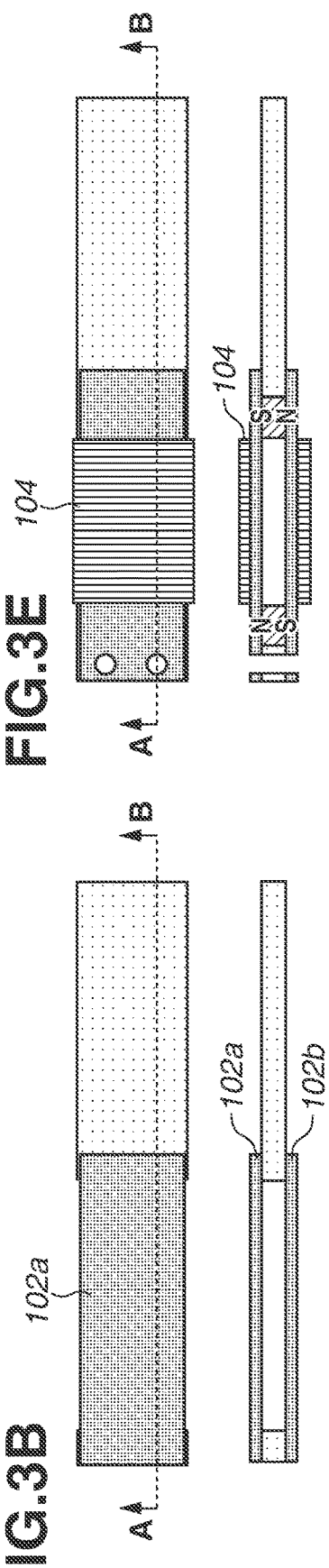
FIG.3E

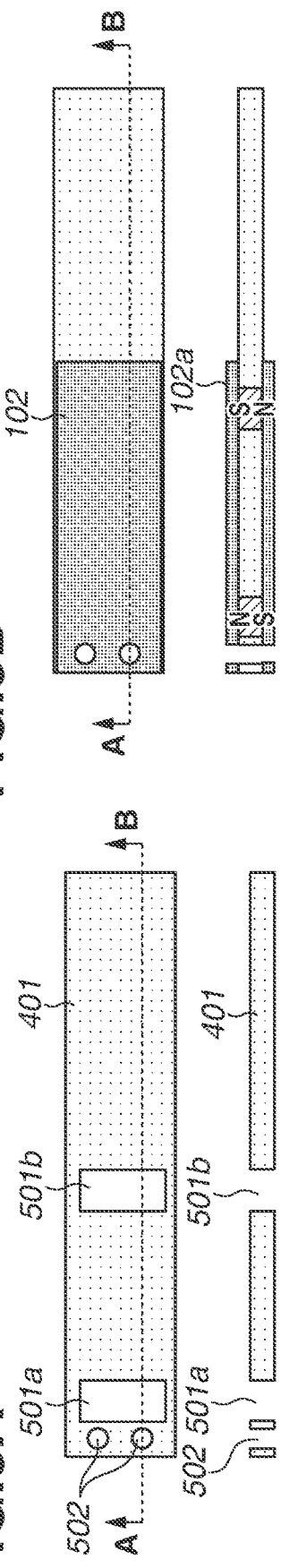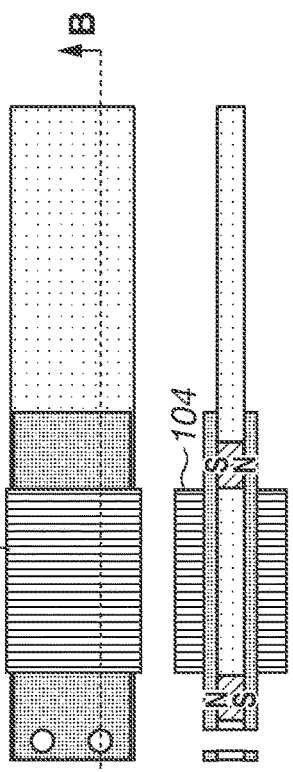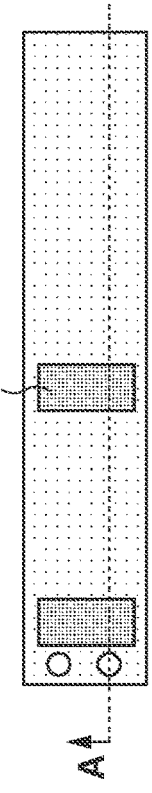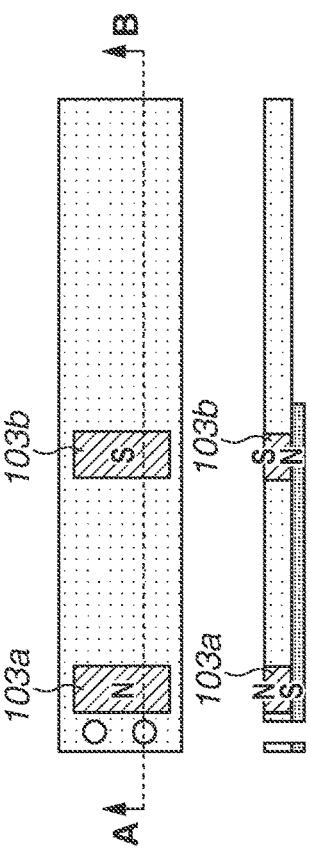
FIG.5A FIG.5B FIG.5C FIG.5D FIG.5E

POWER GENERATION ELEMENT AND POWER GENERATION APPARATUS

CROSS-REFERENCE TO RELATED APPLICATIONS

This application is a Continuation of International Patent Application No. PCT/JP2020/020540, filed May 25, 2020, which claims the benefit of Japanese Patent Application No. 2019-103231, filed May 31, 2019, both of which are hereby incorporated by reference herein in their entireties.

BACKGROUND OF THE INVENTION

Field of the Invention

The disclosure of the present specification relates to a power generation element and an apparatus using the power generation element.

Background Art

In recent years, the "energy harvesting" technology, which acquires power from unused energy existing in the environment, has been attracting attention as an energy saving technology. In particular, vibration power generation, which acquires power from vibrations, has been proposed to be applied to power sources for constantly-communicating Internet of Things (IoT), charging of mobile devices, and the like because its energy density is high compared to thermoelectric power generation, which acquires power from heat. For example, the moving magnet-type power generation method, which generates an induced electromotive force in a coil by vibrating a magnet using vibrations in the environment, has been applied in various forms. Further, in recent years, power generation utilizing the inverse magnetostrictive phenomenon, which changes a magnetic flux density by a change in a force instead of vibration of a magnet, has been proposed (hereinafter referred to as inverse magnetostrictive power generation).

Japanese Patent No. 4905820 discusses a bimorph structure in which two magnetostrictive rods are disposed in parallel as a configuration of an inverse magnetostrictive power generation element.

Japanese Patent No. 4905820 also discusses a structure in which two inverse magnetostrictive power generation elements are arranged in parallel via magnets and are glued together.

However, the conventional method using the plurality of magnetostrictive rods faces an issue that high power cannot be necessarily extracted when being in actual use.

CITATION LIST

Patent Literature

PTL 1: Japanese Patent No. 4905820

Non Patent Literature

NPL 1: "Study on Battery Free Remote Controller Using Magnetostrictive-Vibrational Power Generation Switch" written by Shigeyuki Hatta, Toshiyuki Ueno, and Sotoshi Yamada in Journal of the Japan Society of Applied Electromagnetics and Mechanics (AEM) Vol. 23, No. 1 (2015)

SUMMARY OF THE INVENTION

In consideration of the above-described issue, the disclosure of the present specification is directed to providing a power generation element capable of improving a power generation amount in power generation using a magnetostrictive material, and an apparatus using the power generation element. Not only limited to the above, the disclosure of the present specification is also directed to bringing about an advantageous effect derived from each configuration that will be described in an exemplary embodiment for implementing the present invention, which will be described below, and unable to be acquired by the conventional technique.

According to an aspect of the present invention, a power generation element includes a first magnetostrictive plate and a second magnetostrictive plate each including a magnetostrictive material, a magnet unit including a magnet fixed to at least one of the first magnetostrictive plate or the second magnetostrictive plate, and a coil containing at least part of the first magnetostrictive plate and the second magnetostrictive plate therein, wherein the first magnetostrictive plate and the second magnetostrictive plate are laid out in such a manner that stresses applied to the first magnetostrictive plate and the second magnetostrictive plate are in opposite directions to each other, and the magnet unit is disposed in such a manner that magnetic fields applied to the first magnetostrictive plate and the second magnetostrictive plate are in opposite directions to each other.

Further features of the present invention will become apparent from the following description of exemplary embodiments with reference to the attached drawings.

BRIEF DESCRIPTION OF THE DRAWINGS

FIG. 3A is a schematic view illustrating an example of a method for manufacturing the power generation element according to the first exemplary embodiment.

FIG. 3B is a schematic view illustrating the example of the method for manufacturing the power generation element according to the first exemplary embodiment.

FIG. 3C is a schematic view illustrating the example of the method for manufacturing the power generation element according to the first exemplary embodiment.

FIG. 3D is a schematic view illustrating the example of the method for manufacturing the power generation element according to the first exemplary embodiment.

FIG. 3E is a schematic view illustrating the example of the method for manufacturing the power generation element according to the first exemplary embodiment.

FIG. 5A is a schematic view illustrating an example of a method for manufacturing the power generation element according to the example 2.

FIG. 5B is a schematic view illustrating the example of the method for manufacturing the power generation element according to the example 2.

FIG. 5C is a schematic view illustrating the example of the method for manufacturing the power generation element according to the example 2.

FIG. 5D is a schematic view illustrating the example of the method for manufacturing the power generation element according to the example 2.

FIG. 5E is a schematic view illustrating the example of the method for manufacturing the power generation element according to the example 2.

DESCRIPTION OF THE EMBODIMENTS

In the following description, an exemplary embodiment of the present invention will be described in detail with reference to the accompanying drawings. However, the disclosure of the present specification is not limited to the exemplary embodiment that will be described below, and can be modified in various manners (including an organic combination of examples) based on the spirit of the disclosure of the present specification and is not intended to exclude such modifications from the scope of the disclosure of the present specification. In other words, all of the examples that will be described below and possible configurations constructible by combining the modifications thereof are also included in the exemplary embodiment disclosed in the present specification.

First Exemplary Embodiment

A power generation element according to a first exemplary embodiment is a power generation element that generates power by utilizing the inverse magnetostrictive phenomenon, which changes a magnetic flux density by a change in a force instead of vibration of a magnet. The power generation element according to the present exemplary embodiment is a bimorph-type inverse magnetostrictive power generation element, and is characterized by allowing the number of coils to be reduced by causing magnetic fields applied to the magnetostrictive materials to have opposite directions to each other. (Configuration of Power Generation Element)

Figure 1A:
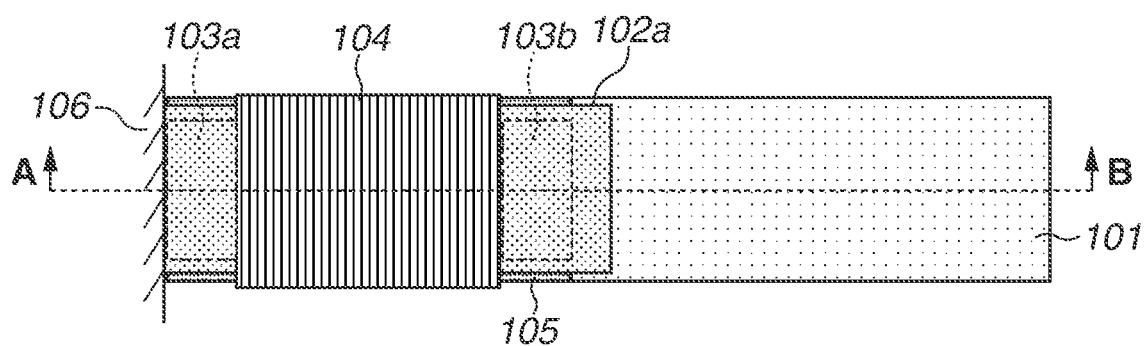
FIG. 1A is a schematic view illustrating an example of a configuration of a power generation element according to a first exemplary embodiment.

A configuration of the power generation element according to the present exemplary embodiment will be described with reference to FIGS. 1A and 1B. FIG. 1A is a schematic top view illustrating the configuration of the power generation element according to the present exemplary embodiment, and FIG. 1B is a schematic cross-sectional view taken along a line A-B in FIG. 1A that illustrates the configuration of the power generation element according to the present exemplary embodiment.

A power generation element 100 according to the present exemplary embodiment is held by a holding unit 106, and includes a coupling plate 101, a magnetostrictive unit 102 including a magnetostrictive plate 102a and a magnetostrictive plate 102b, a magnet unit 103 including a magnet 103a and a magnet 103b, a coil 104, and a non-magnetic region 105. As will be described below, "fixation" between one member and another member may be either fixation with the members in contact with each other or fixation with a different substance interposed between the members. In other words, "fixation" may be any state in which the two members are physically fixed to each other.

One end of the coupling plate 101 is fixed to the magnetostrictive unit 102, and the coupling plate 101 vibrates by receiving an external force such as a compressive stress or a tensile stress. The coupling method of the coupling plate 101 may be any method capable of securely fixing the magnetostrictive unit 102 and the coupling plate 101, and examples of usable methods include, but not particularly limited to, laser welding, adhesion using an adhesive, solder joining, ultrasonic joining, and fixation using a bolt and a nut. Further, desirably, the coupling plate 101 is made from a ductile material because the coupling plate 101 is subjected to continuous application of an external force such as a compressive stress or a tensile stress. Further, the material of the coupling plate 101 is selected depending on a configuration of a magnetic circuit constructed together with the magnetostrictive unit 102. Thus, in a case where the coupling plate 101 is used as an element forming the magnetic circuit, the used material is a magnetic material such as carbon steel, ferritic stainless steel (e.g., SUS430), or martensitic stainless steel (e.g., SUS420J2). On the other hand, in a case where the coupling plate 101 is not used as the element forming the magnetic circuit, the used material is a non-magnetic material such as austenitic stainless steel or the like (e.g., SUS304, SUS303, and SUS316).

Figure 1B:
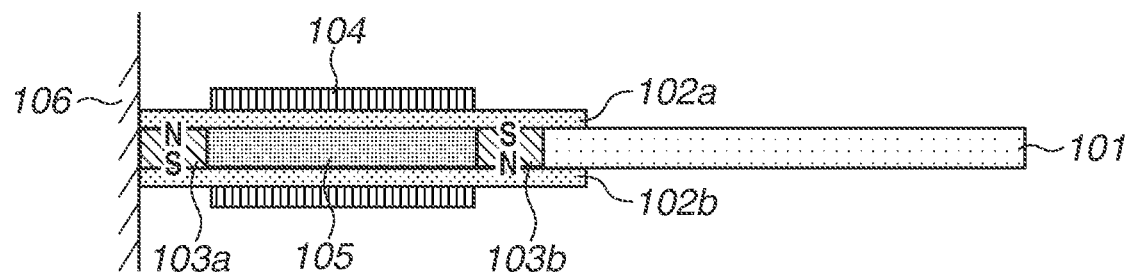
FIG. 1B is a schematic view illustrating the example of the configuration of the power generation element according to the first exemplary embodiment.

Further, the coupling plate 101 is subjected to application of a force so as to vibrate in a vertical direction in FIG. 1B. Herein, vibrations in the vertical direction in FIG. 1B means vibrations in a vertical direction as an in-plane direction of the paper, and corresponds to vibrations in a direction perpendicular to the paper as viewed in FIG. 1A. However, the vibrations of the coupling plate 101 is not limited to the vibrations in the vertical direction in FIG. 1B as long as the vibrations can generate power as a result thereof, and, for example, torsional vibrations can also be utilized. An elastic material such as a spring material may be used for the coupling plate 101 to reduce mechanical attenuation of the vibrations. A force inducing the vibrations in the vertical direction in FIG. 1B can be generated by, for example, application of a ground vibration generated due to the holding unit 106 being fixed to a vertically vibrating vibration source or an operation of applying a force to a tip of the coupling plate 101 opposite to a connection portion thereof and flicking the tip. However, the above-described methods for applying the force are merely examples, and any method capable of applying a force to the magnetostrictive unit 102 may be employed. Further, the above-described materials usable for the coupling plate 101 are merely examples, and the material of the coupling plate 101 is not limited thereto.

The magnetostrictive plate 102a and the magnetostrictive plate 102b constituting the magnetostrictive unit 102 are members including a magnetostrictive material. Desirably, the magnetostrictive unit 102 includes a ductile magnetostrictive material because the magnetostrictive unit 102 is subjected to continuous application of a compressive stress and a tensile stress. Although the type of the magnetostrictive material is not particularly limited, a known magnetostrictive material such as an iron-gallium alloy, an iron-cobalt alloy, an iron-aluminum alloy, an iron-gallium-aluminum alloy, and an iron-silicon-boron alloy is desirably used. Further, the shape of the magnetostrictive unit 102 may be any shape that enables coupling with the coupling plate 101 and is not particularly limited, but a shape such as a cuboidal shape and a cylindrical shape is desirably used.

The magnet 103a and the magnet 103b constituting the magnet unit 103 are attached to magnetize the magnetostrictive plate 102a and the magnetostrictive plate 102b in opposite directions from each other. Examples of the magnet 103a and the magnet 103b include, but not particularly limited to, a neodymium magnetic and a samarium-cobalt magnet.

Further, possible magnetic pole orientations of the magnets 103a and 103b include, but not particularly limited to, a configuration in which the magnetic pole orientations are vertically opposite to each other as illustrated in the schematic cross-sectional view of FIG. 1B. However, the magnetic pole orientations of the magnets 103a and 103b illustrated in the schematic cross-sectional view of FIG. 1B are merely examples, and the north (N) poles and the south (S) poles may be reversed from the illustrated magnetic pole orientations. In other words, the magnet 103a and the magnet 103b may be laid out in a different manner as long as magnetic pole surfaces thereof different from each other are fixed to the magnetostrictive unit 102. Further, a layout and the number of magnets are not particularly limited to the above-described examples as long as the magnetostrictive plate 102a and the magnetostrictive plate 102b are magnetized in opposite directions to each other. Examples of the magnets 103a and 103b include, but not particularly limited to, a neodymium magnetic and a samarium-cobalt magnet. Further, a layout and the number of magnets, the magnetic pole surfaces fixed to the magnetostrictive plates 102a and 102b, and the like are not particularly limited to the above-described examples as long as the magnetostrictive plate 102a and the magnetostrictive plate 102b are magnetized in opposite directions to each other.

The coil 104 is disposed to contain at least part of each of the magnetostrictive plate 102a and the magnetostrictive plate 102b therein, and generates a voltage depending on a change in the magnetic flux over time that occurs in the magnetostrictive plate 102a and the magnetostrictive plate 102b based on the law of electromagnetic induction. Due to the configuration, the number of turns of the coil 104 can be increased independently of a distance between the two magnetostrictive plates 102a and 102b.

Although the material of the coil 104 is not particularly limited, copper wire is desirably used.

Examples of a material for the non-magnetic region 105 include, but not particularly limited to, gas and a solid. Examples of desirably usable materials include air, ductile non-magnetic metal, and austenitic stainless steel (e.g., SUS304, SUS303, and SUS316). Further, the non-magnetic region 105 may be integrated with the coupling plate 101.

Functions

The power generation element 100 according to the present exemplary embodiment is an electromagnetic induction-type power generation element that converts the change in the magnetic flux into the voltage using the coil 104. In the electromagnetic induction, an electromotive force V is generated based on the following formula (1).

$$V = N \times \Delta\Phi/\Delta t \qquad (1)$$

In the formula, N represents the number of turns of the coil 104, and $\Delta\Phi$ represents a change amount of the magnetic flux in a time $\Delta t$. The electromotive force increases as the number of turns of the coil 104 increases, but, an attempt to increase the number of turns with the same volume, if any, raises the necessity of reducing the wire diameter of the coil 104, thereby leading to an increase in the resistance of the coil 104 as a result. In this case, power actually usable in a circuit or the like reduces. In other words, it is important to configure the power generation element 100 so as to allow the coil 104 to have a larger volume to increase the power actually usable in a circuit or the like.

The power generation element 100 according to the present exemplary embodiment is a power generation element that causes the above-described change amount $\Delta\Phi$ in the magnetic flux with the aid of the inverse magnetostrictive phenomenon. The inverse magnetostrictive phenomenon is such a phenomenon in which magnetic permeability changes relative to a stress. For example, the magnetic permeability decreases when a compressive stress is applied to the magnetostrictive material, and increases when a tensile stress is applied to the magnetostrictive material. Because the magnitude of the magnetic permeability is related to the magnitude of the magnetic resistance in the magnetic circuit, application of the stress to the magnetostrictive material brings about a change in the magnetic flux in the magnetostrictive material as a result. Thus, the application of a stress changing over time to the magnetostrictive material causes a change in the magnetic flux over time, thereby generating the electromotive force based on the formula (1).

The present inventors have discovered that a great electromotive force can be acquired using one coil by, with respect to a power generation apparatus in which stresses are applied to two magnetostrictive plates in opposite directions to each other, configuring the power generation apparatus in such a manner that magnetic fields having opposite directions to each other are applied to the two magnetostrictive plates.

In the following description, the principle allowing the power generation element 100 according to the present exemplary embodiment to acquire a great electromotive force will be described with reference to FIGS. 2A and 2B.

Figure 2A:
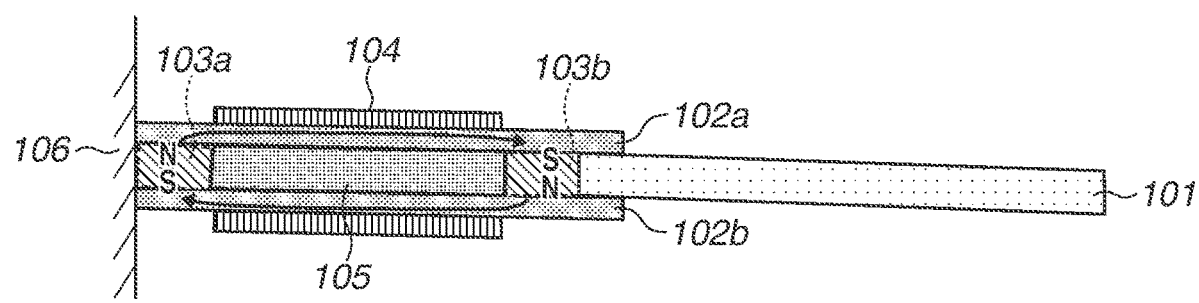
FIG. 2A is a schematic view illustrating an example of a principle of the power generation element according to the first exemplary embodiment.
Figure 2B:
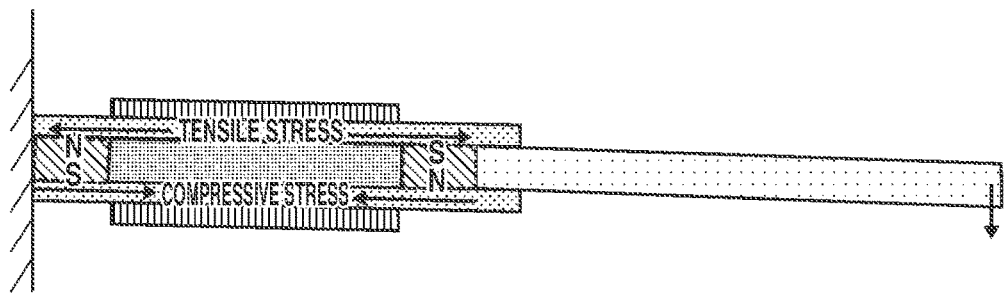
FIG. 2B is a schematic view illustrating the example of the principle of the power generation element according to the first exemplary embodiment.

FIGS. 2A and 2B illustrate examples of directions of applied external magnetic fields and applied stresses at one point of time in the power generation element 100 according to the present exemplary embodiment in schematic cross-sectional views. FIG. 2A illustrates the directions of the external magnetic fields, and FIG. 2B illustrates the directions of the applied stresses. The directions of the external magnetic fields are determined based on the positional relationship between the magnets 103a and 103b. Thus, the directions thereof are fixed to certain directions and do not change over time. Further, in the present exemplary embodiment, the positions of the magnets 103a and 103b are adjusted in such a manner that the external magnetic fields applied to the magnetostrictive plate 102a and the magnetostrictive plate 102b have opposite directions to each other. On the other hand, the directions of the applied stresses change over time. More specifically, for example, a tensile stress may be applied to the magnetostrictive plate 102a, or a compressive stress may be applied to the magnetostrictive plate 102a. Further, a tensile stress may be applied to the magnetostrictive plate 102b, or a compressive stress may be applied to the magnetostrictive plate 102b. Regarding the relationship between the directions of the stresses applied to the magnetostrictive plate 102a and the magnetostrictive plate 102b, the directions are always opposite to each other. In other words, when a tensile stress is applied to one of the magnetostrictive plates 102a and 102b, a compressive stress is applied to the other of the magnetostrictive plates 102a and 102b.

Then, a case is considered where a tensile stress is applied to the magnetostrictive plate 102a and a compressive stress of the same strength is applied to the magnetostrictive plate 102b during the time Δt in FIG. 2B. When the direction of the magnetic field of the magnetostrictive plate 102a in FIG. 2A is a positive direction, a magnetic flux change of $+\Delta\Phi$ occurs in the magnetostrictive plate 102a because the magnetic resistance decreases due to the tensile stress. On the other hand, the magnetostrictive plate 102b undergoes a magnetic flux change of $-\Delta\Phi$ with respect to the direction of the magnetic field of the magnetostrictive plate 102b because the magnetic resistance increases due to the compressive stress. However, the change corresponds to $-(-\Delta\Phi)=+\Delta\Phi$ as the change in the magnetic flux because the direction of the magnetic field of the magnetostrictive plate 102b is the opposite direction to that of the magnetostrictive plate 102a as illustrated in FIG. 2A. As a result, the magnetostrictive plate 102a and the magnetostrictive plate 102b have the magnetic flux changes in the same direction, and a sum of the magnetic flux changes of the magnetostrictive plate 102a and the magnetostrictive plate 102b is calculated to be $\Delta\Phi+\Delta\Phi=2\Delta\Phi$. In other words, the magnetic flux changes occurring in the two magnetostrictive plates 102a and 102b can be converted into an electromotive force using one coil due to the coil 104 containing therein the magnetostrictive unit 102 including the two magnetostrictive plates 102a and 102b. Hypothetically, if the power generation element does not employ such a configuration that the magnetic fields have opposite directions to each other in a power generator in which stresses are applied to the two magnetostrictive plates in opposite directions to each other, which is the characteristic of the power generation element 100 according to the present exemplary embodiment, the above-described change in the magnetic flux of the magnetostrictive plate 102b remains $-\Delta\Phi$. In this case, the sum of the magnetic flux changes of the magnetostrictive plate 102a and the magnetostrictive plate 102b is calculated to be $\Delta\Phi-\Delta\Phi=0$, which means that the magnetic flux changes occurring in the two magnetostrictive plates 102a and 102b cannot be converted into the electromotive force using one coil, or is converted into a electromotive force lower than an electromotive force generated from one magnetostrictive plate.

According to the above description, the power generation amount of the power generation element 100 can be improved by employing the configuration based on the present exemplary embodiment. More specifically, the magnetostrictive plate 102a and the magnetostrictive plate 102b are laid out in such a manner that the stresses applied thereto have opposite directions to each other, and the magnet unit 103 is disposed in such a manner that the magnetic fields applied to the magnetostrictive plate 102a and the magnetostrictive plate 102b have opposite directions to each other. The configuration allows the magnetic flux change occurring on the coil 104 to be converted into an electromotive force without any waste, thereby improving the power generation amount. Further, the configuration allows the number of turns of the coil 104 to be increased without being affected by a space constraint by disposing the coil 104 so as to contain the two magnetostrictive plates 102a and 102b therein in the bimorph-type power generation element, thereby being able to further improve the power generation amount. Further, the configuration of the power generation element 100 according to the present exemplary embodiment eliminates the necessity of winding a coil around a magnetostrictive rod in advance, thereby being able to reduce a manufacturing issue such as breakage or short-circuiting of the coil when attaching the magnetostrictive rod by welding or the like.

EXAMPLES

In the following description, the present exemplary embodiment will be described in detail with reference to specific examples thereof. However, the present invention is not to be limited to the configurations and forms of the examples that will be described below.

Example 1

Method for Manufacturing Power Generation Element

In the present example, the power generation element 100 illustrated in FIGS. 1A and 1B was manufactured. In the following description, each manufacturing process will be described with reference to FIGS. 3A to 3E.

The upper diagrams of FIGS. 3A to 3E are each a schematic top view, and the lower diagrams thereof are each a schematic cross-sectional view taken along a line A-B illustrated in the schematic top view.

First, SUS304-CSP, which was austenitic stainless steel for springs, was used as the coupling plate 101. The SUS304-CSP material had a thickness of 1.5 mm, a width of 16 mm, and a length of 35 mm. SUS304 having a thickness of 1.5 mm, a width of 16 mm, and a length of 5 mm was used as a holding plate 301. A reason for the use of austenitic stainless steel was that it was non-magnetic material and therefore did not affect the magnetic circuit of the magnetostrictive plate 102a and the magnetostrictive plate 102b. Further, a reason for the use of the spring material was that it was revealed as a result of study that mechanical attenuation of the power generation element relating to the power generation performance was smaller than when a normal stainless steel material was used [FIG. 3A].

Next, an iron-gallium alloy having a thickness of 0.5 mm, a width of 15 mm, and a length of 25 mm was used as each of the magnetostrictive plate 102a and the magnetostrictive plate 102b, and the magnetostrictive plates 102a and 102b were bonded to the coupling plate 101 and the holding plate 301 using an epoxy-based adhesive. Subsequently, the magnetostrictive plate 102a and the magnetostrictive plate 102b were joined by applying laser welding to edge lines in contact with the coupling plate 101 and the holding plate 301 among edge lines of the magnetostrictive plates 102a and 102b [FIG. 3B].

Subsequently, holding screw holes 302 for fixing the power generation element 100 using bolts or the like were formed in the magnetostrictive plates 102a and 102b and the holding plate 301. The screw holes 302 allowed the power generation element 100 to be installed at various sites. In the evaluation of the power generation amount of the present example, spacers with screw holes were set up on an optical platen, and the power generation element 100 was fixed on the above-described spacers via the above-described screw holes 302 using bolts [FIG. 3C].

Then, a neodymium magnet having a thickness of 1.5 mm, a width of 12 mm, and a length of 1.5 mm was used as each of the magnet 103a and the magnet 103b. The magnet 103a and the magnet 103b were inserted so as to have magnetic pole orientations opposite to each other as illustrated in FIG. 3D, and after insertion, the magnet 103a and the magnet 103b were fixed by being bonded between the magnetostrictive plate 102a and the magnetostrictive plate 102b using an epoxy-based adhesive [FIG. 3D].

Lastly, as the coil 104, an air core coil having 2000 turns using a copper wire, which is 0.2 mm in wire diameter, was inserted into a region between the magnet 103a and the magnet 103b so as to contain the magnetostrictive plate 102a and the magnetostrictive plate 102b therein, and was fixed using electric insulating varnish [FIG. 3E].

Evaluation of Power Generation Element

The power generation element manufactured in this manner was evaluated in terms of the power generation performance by flicking the tip of the coupling plate 101 and measuring an open voltage generated in the coil 104 using an oscilloscope. An application force that caused the electromotive force to saturate while the application force was gradually increased was used as the application force with which the coupling plate 101 was flicked. Although the application force may be various values depending on the configuration of the power generation element, such an application force was employed because the application force can be said to correspond to the maximum power generation performance of the power generation element. Further, a value acquired by calculating a power generation amount P from a voltage waveform measured by the oscilloscope based on the following formula (2) was used as a quantitative index of the power generation performance.

$$P = \Sigma / (V(t))^2 / (4 \times R) \therefore \Delta t \quad (2)$$

V(t) represented the open voltage measured by the oscilloscope at a time t, R represented the electric resistance, Δt represented the temporal resolution of the oscilloscope, and Σ represented summation with respect to the time t. The effect of inductance of the coil 104 was omitted in the formula of the power generation amount P, and a reason therefor was that a relative comparison was possible because similarly-sized coils were used in the present example and comparative examples. As a result of the measurement and the evaluation by the above-described method, the electric resistance of the coil 104 was 46Ω, the maximum value of the open voltage was 12 V, and the power generation amount P was 1.2 mJ based on the formula (2).

Example 2

Method for Manufacturing Power Generation Element

Figure 4A:
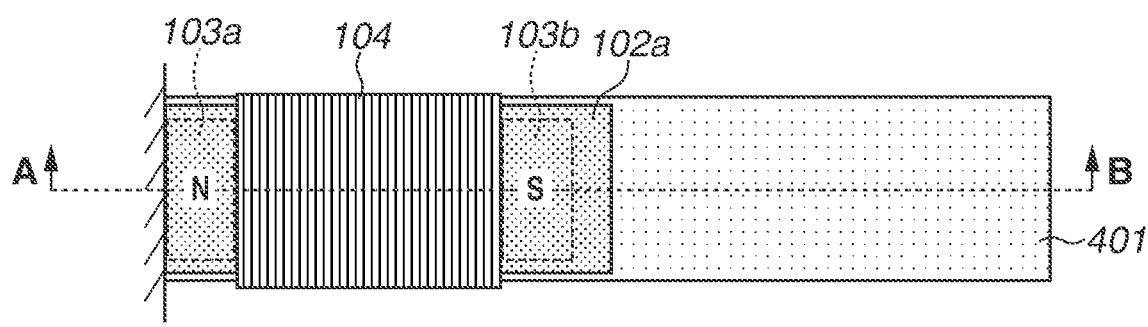
FIG. 4A is a schematic view illustrating an example of a configuration of a power generation element according to an example 2.
Figure 4B:
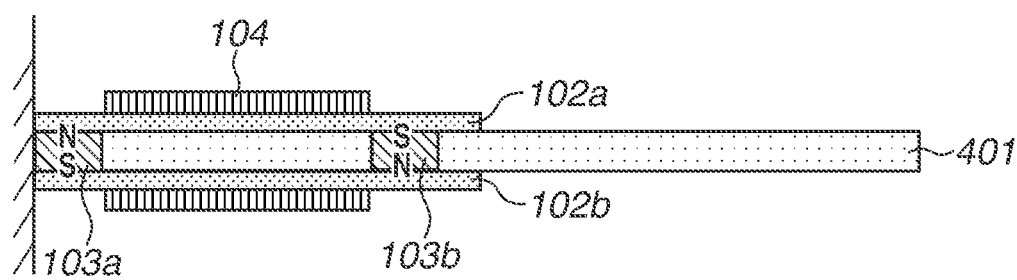
FIG. 4B is a schematic view illustrating the example of the configuration of the power generation element according to the example 2.

In the present example, a power generation element illustrated in FIGS. 4A and 4B was manufactured. The power generation element can be expected to improve the power generation amount because the mechanical attenuation is reduced by supporting the entire edge lines of the magnetostrictive plate 102a and the magnetostrictive plate 102b with a coupling plate including an elastic material having a spring property as in the present example.

In the following description, each manufacturing process will be described with reference to FIGS. 5A to 5E.

The upper diagrams of FIGS. 5A to 5E are each a schematic top view, and the lower diagrams thereof are each a schematic cross-sectional view taken along a line A-B illustrated in the schematic top view.

First, SUS304-CSP, which was austenitic stainless steel for springs, was used as a coupling plate 401. The SUS304-CSP material had a thickness of 1.5 mm, a width of 16 mm, and a length of 55 mm. The coupling plate 401 according to the present example also functions as a holding unit and a non-magnetic unit. Further, a hole 501a and a hole 501b for respectively mounting the magnet 103a and the magnet 103b therein and screw holes 502 for holding the power generation element were opened in the coupling plate 401 in advance [FIG. 5A].

Next, an iron-gallium alloy having a thickness of 0.5 mm, a width of 15 mm, and a length of 25 mm was used as the magnetostrictive plate 102b, and the magnetostrictive plate 102b was bonded to the coupling plate 401 using an epoxy-based adhesive. Subsequently, the magnetostrictive plate 102b was joined by applying laser welding to the edge lines of the magnetostrictive plate 102b in contact with the coupling plate 401 [FIG. 5B].

Then, a neodymium magnet having a thickness of 1.5 mm, a width of 12 mm, and a length of 1.5 mm was used as each of the magnet 103a and the magnet 103b. The magnet 103a and the magnet 103b were inserted so as to have magnetic pole orientations opposite to each other as illustrated in FIG. 5C. When being inserted, the magnet 103a and the magnet 103b were fixed by being bonded to the magnetostrictive plate 102b using an epoxy-based adhesive [FIG. 5C].

Then, an iron-gallium alloy having a thickness of 0.5 mm, a width of 15 mm, and a length of 25 mm was used as the magnetostrictive plate 102a, and the magnetostrictive plate 102a was bonded to the coupling plate 401, the magnet 103a, and the magnet 103b using an epoxy-based adhesive. Subsequently, the magnetostrictive plate 102a was joined by applying laser welding to the edge lines of the magnetostrictive plate 102a in contact with the coupling plate 401 [FIG. 5D].

Lastly, as the coil 104, an air core coil having 2000 turns using a copper wire, which is 0.2 mm in wire diameter, was inserted into a region between the magnet 103a and the magnet 103b so as to contain the magnetostrictive plate 102a and the magnetostrictive plate 102b therein, and was fixed using electric insulating varnish [FIG. 5E].

Evaluation of Power Generation Element

Figure 6:
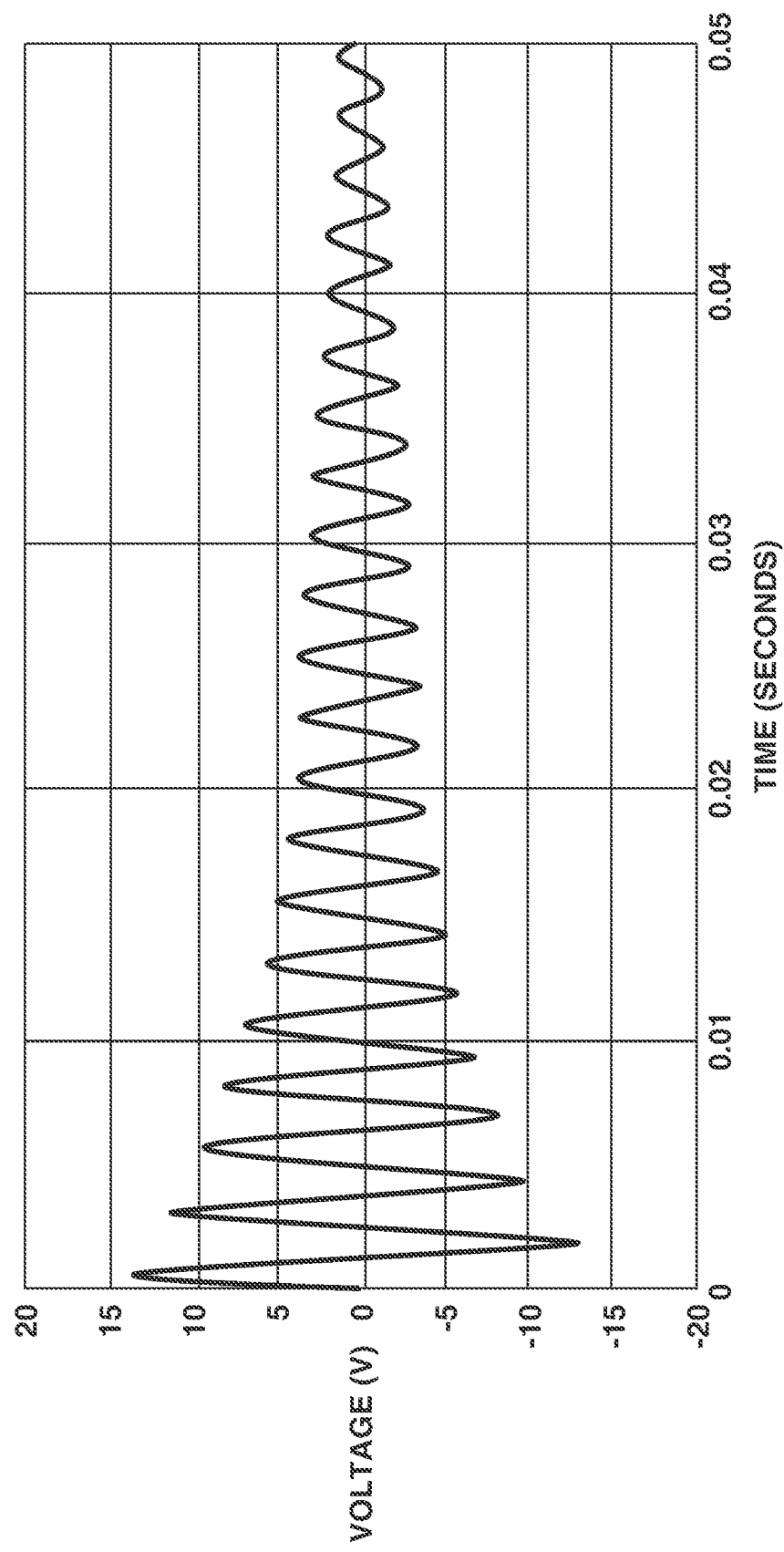
FIG. 6 illustrates an example of a change over time in an electromotive force of the power generation element according to the example 2.

The power generation element manufactured in this manner was evaluated in terms of the power generation performance in a similar manner to the example 1. FIG. 6 illustrates an example of a voltage waveform measured by the oscilloscope. As a result of the evaluation, the electric resistance of the coil 104 was 46Ω, the maximum value of the open voltage was 14 V, and the power generation amount P was 3.2 mJ.

Example 3

Method for Manufacturing Power Generation Element

Figure 7A:
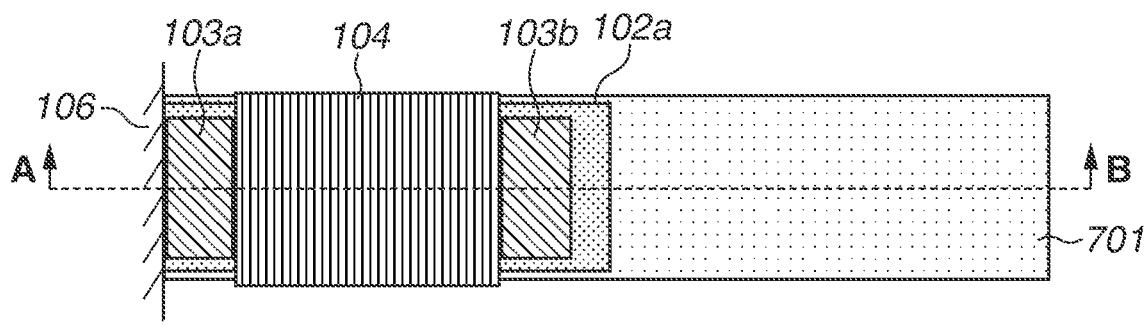
FIG. 7A is a schematic view illustrating an example of a configuration of a power generation element according to an example 3.
Figure 7B:
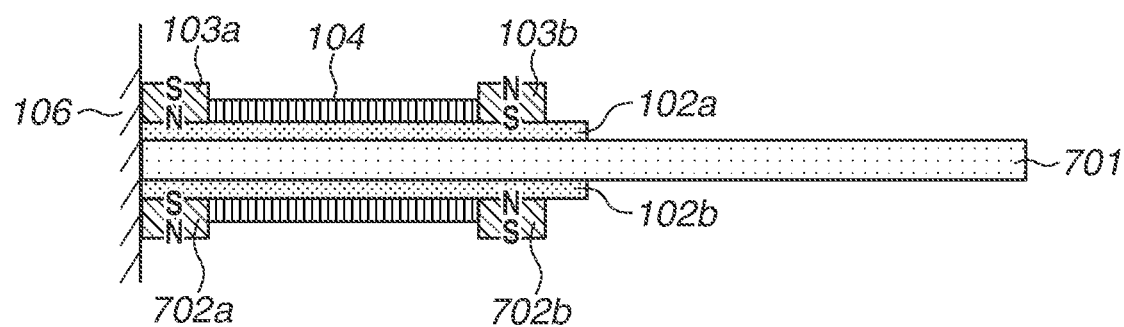
FIG. 7B is a schematic view illustrating the example of the configuration of the power generation element according to the example 3.

In the present example, a power generation element illustrated in FIGS. 7A and 7B was manufactured. The manufacturing process can be simplified by configuring the power generation element in such a manner that the magnets are not sandwiched between the magnetostrictive plate 102a and the magnetostrictive plate 102b as in the present example. However, in such a case that the thickness of a coupling plate 701 is 2 mm or thinner, the magnetic circuit is closed between the magnet 103a and a coupling plate 702a and between the magnet 103b and a coupling plate 702b even when the coupling plate 701 is non-magnetic. This results in application of no magnetic field to the magnetostrictive plate 102a and the magnetostrictive plate 102b, thereby leading to a reduction in the power generation amount. In sum, the present example 3 is a configuration intended to acquire a large power generation amount when the coupling plate 701 is thick.

Figure 8A:
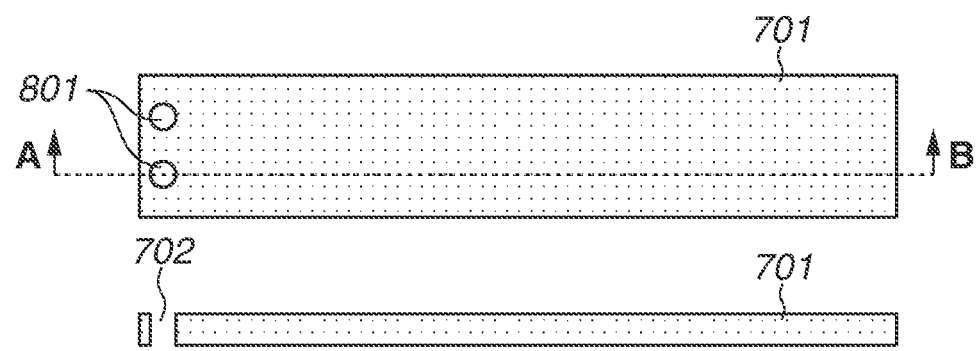
FIG. 8A is a schematic view illustrating an example of part of a method for manufacturing the power generation element according to the example 3.
Figure 8B:
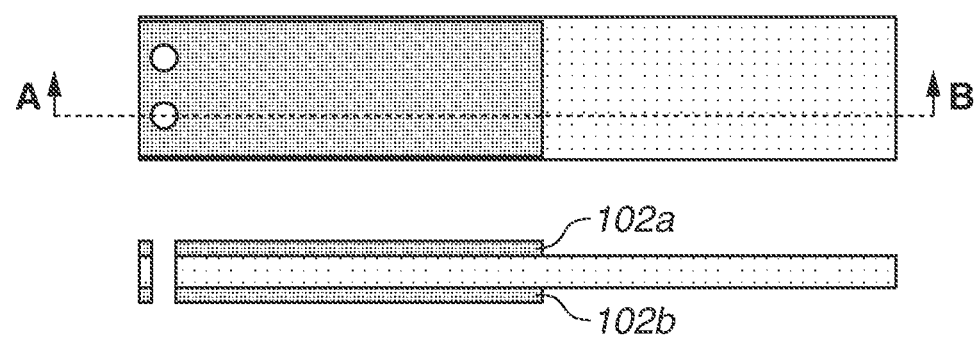
FIG. 8B is a schematic view illustrating the example of the part of the method for manufacturing the power generation element according to the example 3.
Figure 8C:
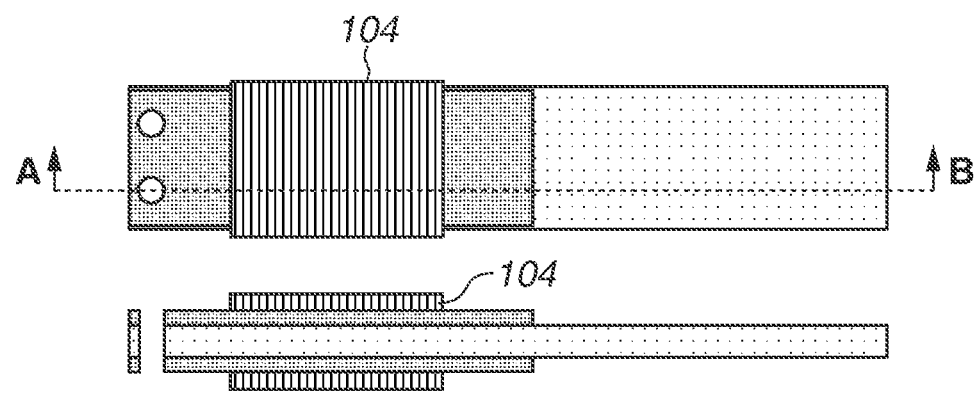
FIG. 8C is a schematic view illustrating the example of the part of the method for manufacturing the power generation element according to the example 3.

In the following description, each manufacturing process will be described with reference to FIGS. 8A to 8C.

First, SUS304-CSP, which was austenitic stainless steel for springs, was used as the coupling plate 701. The SUS304-CSP material had a thickness of 1.5 mm, a width of 16 mm, and a length of 55 mm. The coupling plate 701 according to the present example also functions as a holding unit and a non-magnetic unit. Further, screw holes 801 for holding the power generation element was opened on the coupling plate 701 in advance [FIG. 8A].

Next, an iron-gallium alloy having a thickness of 0.5 mm, a width of 15 mm, and a length of 25 mm was used as each of the magnetostrictive plate 102a and the magnetostrictive plate 102b, and the magnetostrictive plates 102a and 102b were bonded to the coupling plate 701 using an epoxy-based adhesive. Subsequently, the magnetostrictive plate 102a and the magnetostrictive plate 102b were joined by applying laser welding to the edge lines of the magnetostrictive plates 102a and 102b in contact with the coupling plate 701 [FIG. 8B].

Subsequently, as the coil 104, an air core coil having 2000 turns using a copper wire, which is 0.2 mm in wire diameter, was inserted so as to contain the magnetostrictive plate 102a and the magnetostrictive plate 102b therein, and was fixed using electric insulating varnish [FIG. 8C].

Lastly, a neodymium magnet having a thickness of 1.5 mm, a width of 12 mm, and a length of 1.5 mm was used as each of the magnet 103a, the magnet 103b, the coupling plate 702a, and the coupling plate 702b. As illustrated in FIGS. 7A and 7B, the magnets 103a and 103b were bonded on the magnetostrictive plate 102a at the both ends of the coil 104 using an epoxy-based adhesive in such a manner that the magnetic fields in the magnetostrictive plate 102a and the magnetostrictive plate 102b are in opposite directions to each other [FIGS. 7A and 7B].

Evaluation of Power Generation Element

The power generation element manufactured in this manner was evaluated in terms of the power generation performance in a similar manner to the example 1. As a result of the evaluation, the electric resistance of the coil 104 was 46Ω, the maximum value of the open voltage was 10 V, and the power generation amount P was 0.4 mJ.

Example 4

Method for Manufacturing Power Generation Element

Figure 9A:
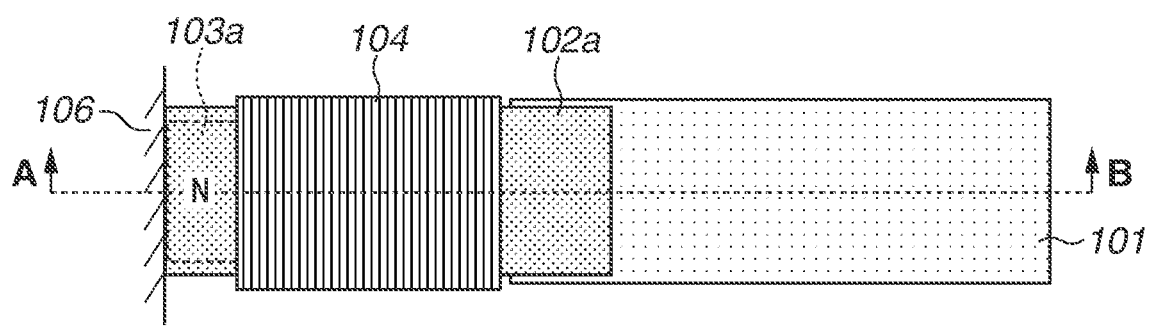
FIG. 9A is a schematic view illustrating an example of a configuration of a power generation element according to an example 4.
Figure 9B:
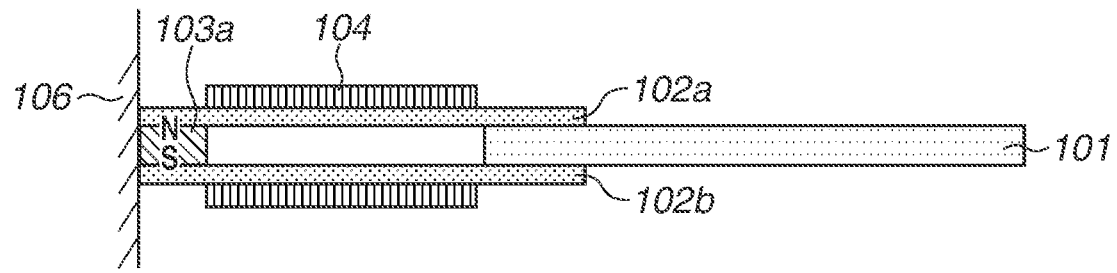
FIG. 9B is a schematic view illustrating the example of the configuration of the power generation element according to the example 4.

In the present example, a power generation element illustrated in FIGS. 9A and 9B was manufactured. The number of magnets can be reduced to one by making the coupling plate 101 from magnetic metal as in the present example.

The manufacturing process is similar to that in FIGS. 3A to 3E according to the example 1, but is characterized by the absence of the magnet 103b and differences in the dimension and the material of the coupling plate 101. Examples of materials usable for the coupling plate 101 include carbon steel, ferritic stainless steel (e.g., SUS430), and martensitic stainless steel (e.g., SUS420J2), which are magnetic metal, unlike in the example 1. In the present example, SUS420J2 was used and was formed so as to have a thickness of 1.5 mm, a width of 16 mm, and a length of 56.5 mm.

Evaluation of Power Generation Element

The power generation element manufactured in this manner was evaluated in terms of the power generation performance in a similar manner to the example 1. As a result of the evaluation, the electric resistance of the coil 104 was 46Ω, the maximum value of the open voltage was 4 V, and the power generation amount P was 0.2 mJ.

Comparative Example 1

Method for Manufacturing Power Generation Element

In the present comparative example, a power generation element in a case where the magnetic pole directions of the magnets were the same as each other was manufactured from the example 2 illustrated in FIGS. 4A and 4B. The manufacturing method is similar to that in FIGS. 5A to 5E, but is different in that the magnetic pole directions are the same between the magnet 103a and the magnet 103b in FIG. 5C, unlike in the example 2.

Evaluation of Power Generation Element

The power generation element manufactured in this manner was evaluated in terms of the power generation performance in a similar manner to the example 1. As a result of the evaluation, power generation was unable to be observed.

Comparative Example 2

Method for Manufacturing Power Generation Element

Figure 10A:
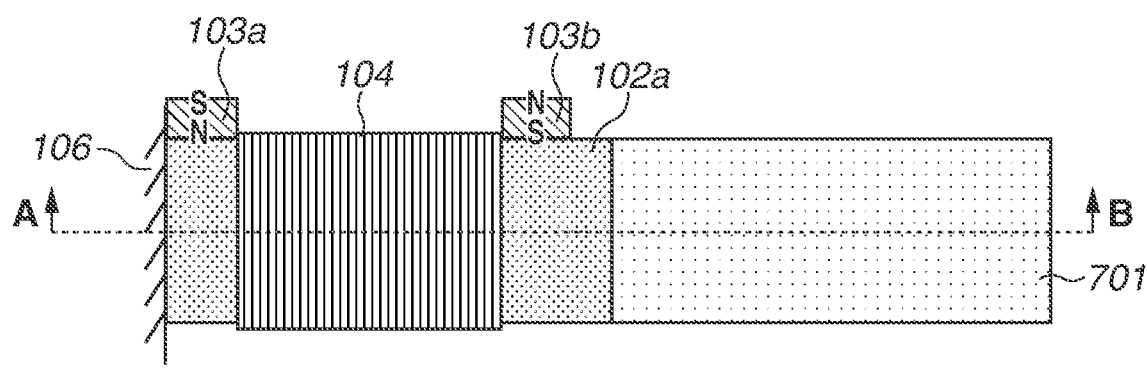
FIG. 10A is a schematic view illustrating an example of a configuration of a power generation element according to a comparative example 2.
Figure 10B:
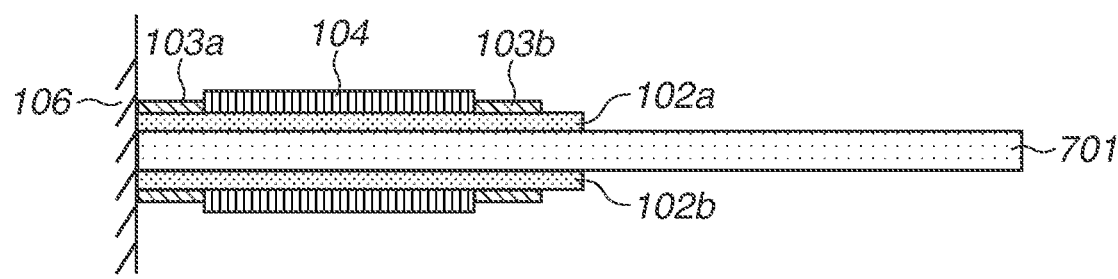
FIG. 10B is a schematic view illustrating the example of the configuration of the power generation element according to the comparative example 2.

In the present example, a power generation element illustrated in FIGS. 10A and 10B was manufactured. The manufacturing process is similar to that in FIGS. 8A to 8C, but is different in terms of the positions of the magnets 103a and 103b. Magnetic fields in the same direction are applied to the magnetostrictive plate 102a and the magnetostrictive plate 102b by positioning the magnets 103a and 103b as illustrated in FIGS. 10A and 10B.

Evaluation of Power Generation Element

The power generation element manufactured in this manner was evaluated in terms of the power generation performance in a similar manner to the example 1. As a result of the evaluation, power generation was unable to be observed.

Comparative Example 3

Method for Manufacturing Power Generation Element

Figure 11A:
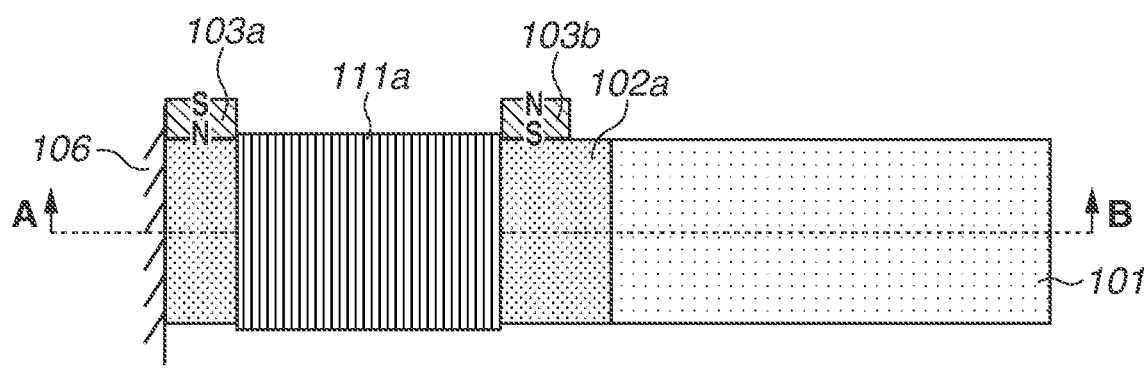
FIG. 11A is a schematic view illustrating an example of a configuration of a power generation element according to a comparative example 3.
Figure 11B:
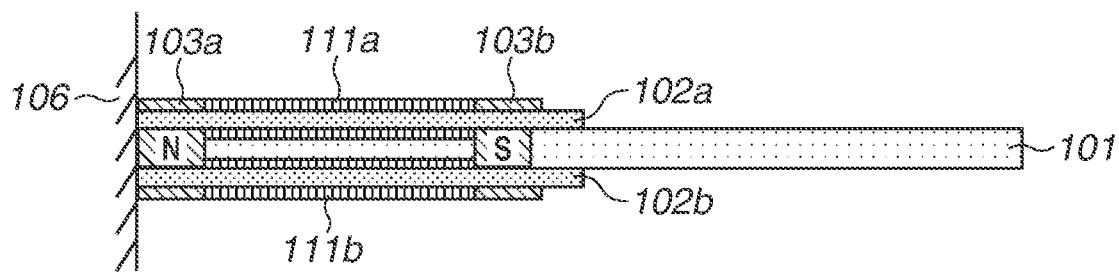
FIG. 11B is a schematic view illustrating the example of the configuration of the power generation element according to the comparative example 3.

In the present example, a power generation element illustrated in FIGS. 11A and 11B was manufactured. The manufacturing process will be described below. The magnetostrictive plate 102a around which a coil 111a is wound and the magnetostrictive plate 102b around which a coil 111b is wound (0.5 mm in thickness, 15 mm in width, and 25 mm in length) were prepared in advance. The prepared magnetostrictive plates 102a and 102b were bonded to the coupling plate 101 (1.5 mm in thickness, 15 mm in width, and 35 mm in length) made from SUS304-CSP using an epoxy-based resin, and then were joined by applying laser welding with careful attention to avoid breakage of the coils 111a and 111b. The magnet 103a and the magnet 103b were laid out as illustrated in FIGS. 11A and 11B. Magnetic fields in the same direction were applied to the magnetostrictive plate 102a and the magnetostrictive plate 102b due to the layout. Further, since the above-described coils 111a and 111b were wound around the respective magnetostrictive plate 102a and magnetostrictive plate 102b, the coils 111a and 111b using a copper wire of 0.2 mm were able to be wound approximately 180 turns only due to the constraint derived from the distance between the magnetostrictive plate 102a and the magnetostrictive plate 102b.

Evaluation of Power Generation Element

The power generation element manufactured in this manner was evaluated in terms of the power generation performance in a similar manner to the example 1. As a result of the evaluation, the maximum value of the open voltage was 2 V, and the power generation amount P was 0.1 mJ.

It can be confirmed from the above-described results that the present invention can improve the power generation amount without the coil mounting region being restricted by the structure of the power generation element even when the number of magnetostrictive rods is increased and by mounting only one coil.

While the exemplary embodiment and the examples of the present invention have been described specifically, the present invention is not to be limited to the above-described exemplary embodiment. The present invention can be modified in various manners based on the technical idea thereof. For example, the numerical values and the components described in the above-described exemplary embodiment are merely examples. Numerical values and components different therefrom may be used as necessary. For example, the number of turns of the coil is 2000 turns in the present examples, but the number of turns thereof may be larger because no constraint is imposed except for an installation space. In this case, the difference in the power generation amount from the above-described comparative examples is further widened.

Using the power generation element according to any of the above-described exemplary embodiment and examples allows power to be generated by a larger amount than those of existing magnetostrictive power generators, thereby allowing the power generators to be reduced in size. Therefore, the present power generation element is especially effective as a power generator for such an apparatus installation in which has been difficult due to the size so far. For example, the present power generation element can be used as a power generator for a mobile device or the like. Further, the present power generation element can also be expected to be used as a power source for various kinds of apparatuses including Internet of Things (IoT) appliances by being installed in a housing of, for example, industrial equipment, office equipment, or medical equipment that operates so as to generate vibrations, or an automobile, a railroad vehicle, an airplane, a heavy machinery, or a ship. The present invention can improve the performance of the power generator, and therefore can also be applied to a wide range of fields other than the above-described fields.

The present invention is not limited to the above-described exemplary embodiment, and can be changed and modified in various manners without departing from the spirit and the scope of the present invention. Therefore, the following claims are attached to make the scope of the present invention public.

According to the disclosure of the present specification, it is possible to provide a power generation element capable of improving a power generation amount in power generation using a magnetostrictive material, and an apparatus using the power generation element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A power generation element comprising:
   a first magnetostrictive plate and a second magnetostrictive plate each including a magnetostrictive material;
   a magnet unit including a magnet fixed to at least one of the first magnetostrictive plate or the second magnetostrictive plate;
   a coil containing at least part of the first magnetostrictive plate and the second magnetostrictive plate therein, and
   a coupling plate configured to vibrate by receiving an external force, the coupling plate being disposed between the first magnetostrictive plate and the second magnetostrictive plate,
   wherein the first magnetostrictive plate and the second magnetostrictive plate are laid out in such a manner that stresses applied to the first magnetostrictive plate and the second magnetostrictive plate are in opposite directions to each other, and the magnet unit is disposed in such a manner that magnetic fields applied to the first magnetostrictive plate and the second magnetostrictive plate are in opposite directions to each other,
   wherein the stresses are applied from the coupling plate to the first magnetostrictive plate and the second magnetostrictive plate,
   wherein the coupling plate extends from an end of either one of the first magnetostrictive plate and the second magnetostrictive plate to an end of the other one of the first magnetostrictive plate and the second magnetostrictive plate and has a hole in which a portion of the magnet unit is inserted.

2. The power generation element according to claim 1, wherein the magnet unit is fixed between the first magnetostrictive plate and the second magnetostrictive plate.

3. The power generation element according to claim 2, wherein the magnet unit includes a first magnet and a second magnet, and the first magnet and the second magnet are disposed in such a manner that magnetic pole surfaces of the first magnet and the second magnet different from each other are fixed to the first magnetostrictive plate and the second magnetostrictive plate.

4. The power generation element according to claim 3, wherein the coil is disposed between the first magnet and the second magnet.

5. The power generation element according to claim 2, wherein the magnet unit includes at least two or more magnets, the at least two or more magnets being fixed to any one of the first magnetostrictive plate or the second magnetostrictive plate, at least one or more of the magnets being fixed to each of the first magnetostrictive plate and the second magnetostrictive plate.

6. The power generation element according to claim 2, wherein the magnet unit is one magnet, and the coil is disposed between the one magnet and a coupling plate.

7. The power generation element according to claim 1, wherein a coupling plate includes at least any one of a non-magnetic material, a magnetic material, or an elastic material.

8. The power generation element according to claim 1, wherein the first magnetostrictive plate and the second magnetostrictive plate include at least any one of an iron-gallium alloy, an iron-cobalt alloy, an iron-aluminum alloy, an iron-gallium-aluminum alloy, or an iron-silicon-boron alloy.

9. The power generation element according to claim 1, wherein the stresses applied to the first magnetostrictive plate and the second magnetostrictive plate are in the opposite directions to each other means that a compressive stress is applied to one of the first magnetostrictive plate or the second magnetostrictive plate and a tensile stress is applied to the other of the first magnetostrictive plate or the second magnetostrictive plate.

10. A power generation apparatus comprising:

the power generation element according to claim 1; and a mechanism configured to apply a force to the power generation element.

11. A power generation apparatus comprising:

the power generation element according to claim 1; and a mechanism configured to cause the power generation element to vibrate due to a ground vibration.

* * * * *